(12) United States Patent
Hawker et al.

(10) Patent No.: US 6,423,465 B1
(45) Date of Patent: Jul. 23, 2002

(54) PROCESS FOR PREPARING A PATTERNED CONTINUOUS POLYMERIC BRUSH ON A SUBSTRATE SURFACE

(75) Inventors: Craig Jon Hawker, Los Gatos; James Lupton Hedrick, Pleasanton; William Dinan Hinsberg, III, Fremont, all of CA (US); Marc Husemann, Hamburg (DE); Michael Morrison, Addison, TX (US)

(73) Assignees: International Business Machines Corporation, Armonk, NY (US); The Board of Trustees of the Leland Stanford Junior University, Palo Alto, CA (US)

( * ) Notice: Subject to any disclaimer, the term of this patent is extended or adjusted under 35 U.S.C. 154(b) by 0 days.

(21) Appl. No.: 09/493,450

(22) Filed: Jan. 28, 2000

(51) Int. Cl.$^7$ .............. G03F 7/11; G03F 7/38; G03F 7/40; G03C 8/00
(52) U.S. Cl. .............. 430/203; 430/327; 430/330; 430/350; 430/272.1
(58) Field of Search .............. 430/203, 327, 430/350, 330

(56) References Cited

U.S. PATENT DOCUMENTS 5,462,990 A * 10/1995 Hubbell et al. .......... 525/54.1
5,858,585 A * 1/1999 Haarer et al. .......... 420/330

FOREIGN PATENT DOCUMENTS

WO       wo-92/15628    * 9/1992

OTHER PUBLICATIONS

Husemann et al, "Manipulation of surface properties by patterning of covalently bound polymer brushes", J. Am. Chem. Soc., 2000, 1222, 1844–1845,American chemical society published on Web Feb. 12, 2000.*

Biesalski et al. (1999), "Preparation and Characterization of a Polyelectrolyte Monolayer Covalently Attached to a Planar Solid Surface," *Macromolecules* 32(7):2309–2316. No Month Given.

Clark et al. (1998), "Engineering the Microfabrication of Layer–By–Layer Thin Films," *Advanced Materials* 10(18):1515–1519. No Month Given.

(List continued on next page.)

*Primary Examiner*—Cynthia Hamilton
(74) *Attorney, Agent, or Firm*—Reed & Associates

(57) ABSTRACT

A method is disclosed for preparing a patterned continuous polymeric brush on a substrate surface. The method generally involves functionalization of the substrate surface followed by surface-initiated polymerization at the initiation sites so provided, e.g., using a living free radical polymerization technique or the like, whereby a covalently bound continuous polymeric brush results, with acid-labile groups present throughout. An acid is then applied to the continuous polymer brush in a predetermined pattern, under conditions that result in removal of the acid-labile groups in at least one first region of the continuous polymer brush but not in at least one second region of the continuous polymer brush. In a preferred embodiment, the acid is a photogenerated acid resulting from imagewise irradiation of a photoacid generator applied as a film or coating to the surface-bound polymer brush.

20 Claims, 3 Drawing Sheets

OTHER PUBLICATIONS

Husemann et al. (1999), "Surface–Initiated Polymerization for Amplification of Self–Assembled Monolayers Patterned by Microcontact Printing," *Angew. Chem. Int. Ed.* 38(5):647–649. No Month Given.

Lackowski et al., "Micron–Scale Patterning of Hyperbranched Polymer Films by Micro–Contact Printing," *J. Am. Chem. Soc.* 121(6):1419–1420, Published on Web Feb. 2, 1999.

Prucker et al. (1998), "Synthesis of Poly(styrene) Monolayers Attached to High Surface Area Silica Gels Through Self–Assembled Monolayers of Azo Initiators," *Macromolecules* 31(3):592–601. No Month Given.

Prucker et al. (1998), "Mechanism of Radical Chain Polymerizations Initiated by Azo Compounds Covalently Bound to the Surface of Spherical Particles," *Macromolecules* 31(3):602–613. No Month Given.

Rühe (1997), "Polymers Grafted From Solid Surface," *Macromol. Symp.* 126:215–222. No Month Given.

Yan et al. (1999), "Patterning Thin Films of Poly(ethylene imine) on a Reactive SAM Using Microcontact Printing," *Langmuir* 15(4):1208–1214. No Month Given.

Zhao et al. (1999), "Preparation of Highly Impermeable Hyperbranched Polymer Thin–Film Coatings Using Dendrimers First as Building Blocks and then as in Situ Thermosetting Agents," *J. Am. Chem. Soc.* 121(5):923–930. No Month Given.

\* cited by examiner

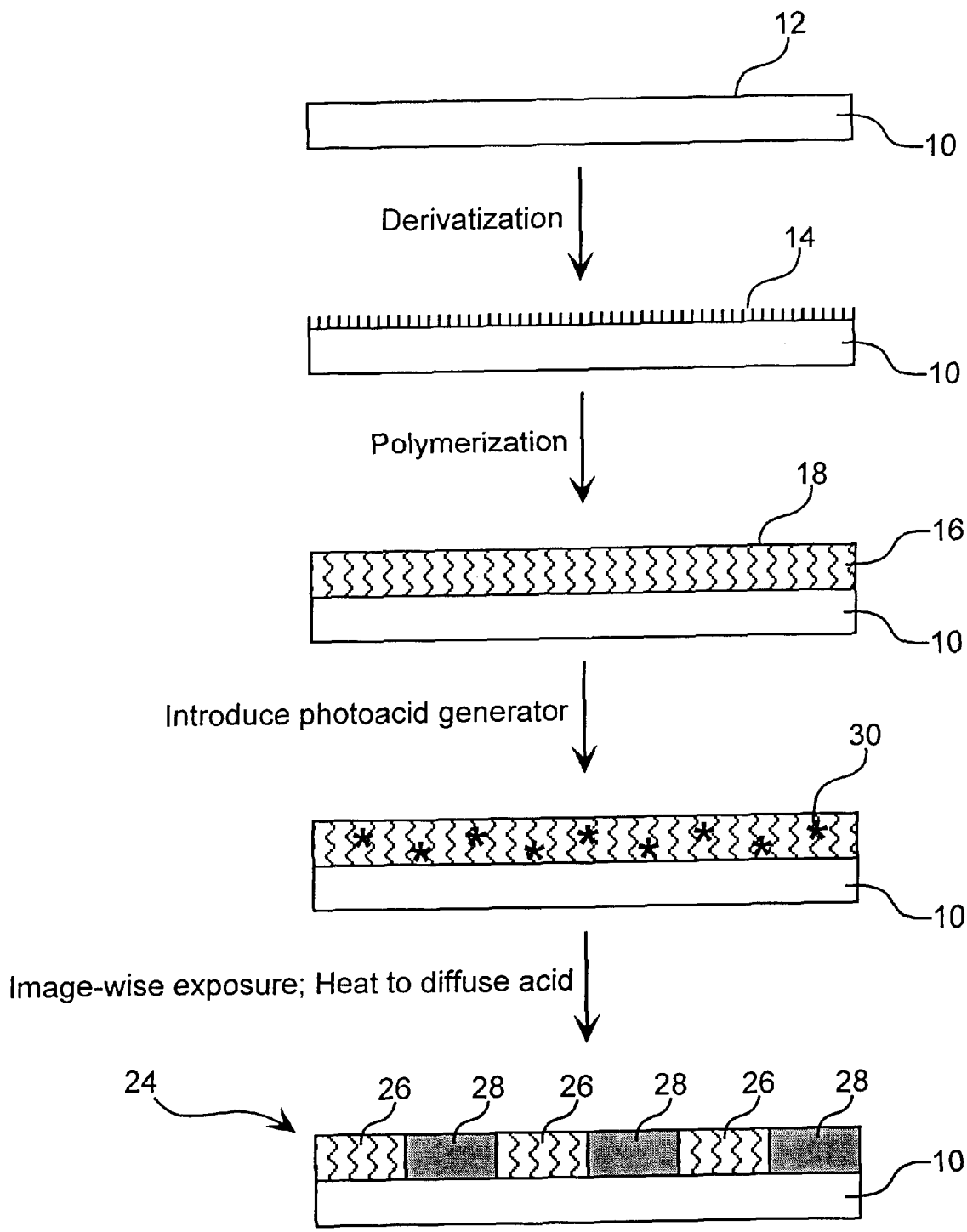

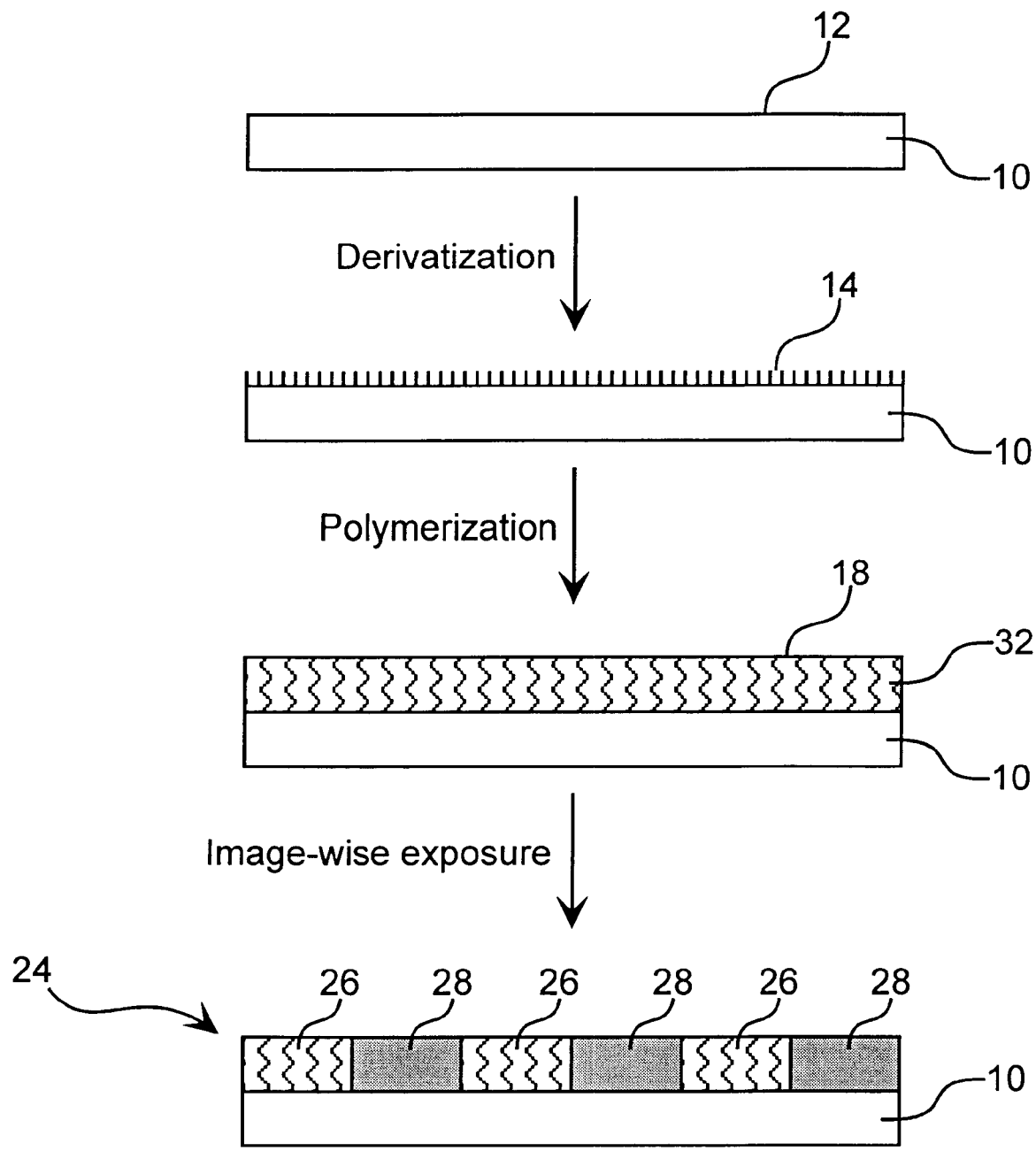

PROCESS FOR PREPARING A PATTERNED CONTINUOUS POLYMERIC BRUSH ON A SUBSTRATE SURFACE

TECHNICAL FIELD

This invention relates generally to the chemical modification of surfaces so as to provide a pattern thereon, and more particularly relates to a process for preparing a patterned continuous polymeric brush on a substrate surface. The invention has utility in the fields of microelectronic circuitry and semiconductor manufacturing, solid phase chemical synthesis, and biotechnology, e.g., in preparing biosensors, high-density assay plates, and the like.

BACKGROUND

A well-known method for manufacturing electronic devices such as integrated circuits and the like involves photolithography, wherein a radiation-sensitive lithographic photoresist composition is applied through spin casting as a thin coating on the exposed surface of a substrate. The coating is subsequently "baked" to remove the casting solvent. The photoresist film is then exposed to radiation in an imagewise fashion, and the image is developed, typically by immersion in a developer solvent. Because of the difference in solubility between the exposed and unexposed photoresist in the developer solvent, either the exposed or unexposed portion of the photoresist is washed from the surface to produce a predetermined pattern of resist on the surface. With a so-called "positive" resist, it is the exposed areas that are removed, while with a "negative" resist, it is the unexposed areas that are removed. Advantages in photolithographically patterning spin-cast films include high resolution of features and reproducibility.

However, attempts to perform chemistry on patterned spin-cast films, or to employ these films in solvating environments, often fail because the films dissolve or swell in typical reaction media. Thus, there exists a need in the art for a reproducible method of preparing a substrate surface according to a predetermined pattern wherein the pattern is stable to a wide range of different environments and processing conditions, e.g., wherein any dissolution or swelling of the pattern composition is negligible, and wherein chemistry can be performed on the surface pattern with no dissolution, degradation or removal thereof The method would ideally result in patterns having discrete surface properties such as hydrophilic and hydrophobic portions with resolution in at least the micron or submicron domain.

Polymer brushes, in contrast to patterned spin-cast films, are stable with respect to a range of environmental and processing conditions. As with preparation of self-assembled monolayers (SAMs), polymer brushes are typically formed by first depositing initiating groups on a substrate surface that covalently bind thereto. Then, macromolecular chains are grown from the initiating groups using monomers that are typically similar to those traditionally used in microlithography, e.g., t-butyl acrylate. The covalent bonding of the macromolecular chains to the substrate surface opens up a number of possibilities that are not available with traditional spin-cast films. These advantages permit the use of these films in technological applications that include specialty photoresists, sensors and microfluidic networks.

A number of different approaches to synthesis of patterned polymer brushes have been described. For example, Ruhe et al. have reported the patterning of surface bound initiators by either photoablation or photoinitiation, followed by polymerization to give discrete areas of polymer brushes (Prucker et al. (1998) *Macromolecules* 31 592; Prucker et al. (1998) *Macromolecules* 31:602; Ruhe et al. (1997) *J. Macromol. Symp.* 126:215; Biesalski et al. (1999) *Macromolecules* 32:2309), while Clark et al. have detailed the growth of patterned polymer films using layer by layer techniques (Clark et al. (1998) *Adv. Mater.* 10:1515). In addition, a number of groups have also reported the elaboration of microcontact printed thiol monolayers to provide patterned polymer brushes; see, for example, Yan et al. (1 999) *Langmuir* 15:1208, Lackowski et al. (1999) *J. Am. Chem. Soc.* 121:1419, and Husemann et al. (1999) *Angew Chem. Int. Ed. Engl.* 38:647. Yan et al. describes patterned thin films of poly(ethylene imine) on reactive SAMs, while Lackowski et al. has employed microcontact printing to prepare a patterned thiol monolayer on Au containing discrete areas of functional groups that are transformed into patterned hyperbranched poly(acrylic acid) films using a stepwise growth strategy as described by Zhao et al. (1999) *J. Am. Chem. Soc.* 121:923. The structures produced by these two strategies are similar in that polymer brushes are not continuous over the substrate surface, with the well-defined areas of polymer brushes being separated by substrate surface/monolayer. However, none of these approaches addresses the alternative and potentially more useful and versatile structure in which a continuous polymer brush is patterned into chemically distinct regions.

This invention is addressed to the aforementioned need in the art, and provides a method to form polymer brushes that are patterned so as to contain discrete and well-defined regions that are chemically distinct and have different surface properties, e.g., discrete regions of hydrophilic and hydrophobic polymer brushes. Such polymer brushes, having domains with different surface properties, enable control of surface chemistry and can be used in a variety of ways to take advantage of differential surface interaction with external agents, e.g., wet and dry etchants and the like. The method is readily adaptable for use with current semiconductor processing technologies, and provides an extremely stable, high resolution, versatile product.

SUMMARY OF THE INVENTION

Accordingly, it is a primary object of the present invention to address the above-mentioned need in the art by providing a method for forming a continuous polymeric brush that is patterned into two or more chemically distinct regions, wherein the method generally involves:

(a) providing a substrate having a surface to which molecular moieties can covalently bind;

(b) contacting the surface with a polymerization composition under conditions effective to provide a continuous polymer brush, wherein the polymerization composition is such that the continuous polymer brush contains labile groups selected from the group consisting of acid-labile, base-labile, and photolabile groups; and (c) applying a cleavage agent selected from the group consisting of acid, base, and radiation to the continuous polymer brush in a predetermined pattern under conditions that promote reaction between the labile groups and the cleavage agent.

In a preferred embodiment, the surface is initially modified by reaction with a derivatizing composition comprised of a derivatizing moiety having a reactive site for reaction with the surface and a functional group, such that surface-bound functional groups result that serve as polymerization sites. A surface-initiated polymerization process is then conducted, e.g., a living free radical polymerization process, using reactive monomers having acid, base or photolabile groups. Application of a cleavage agent (i.e., an appropriate chemical reagent and/or radiation) to the continuous polymer brush so provided is carried out in a manner that results in removal of the labile groups in at least one first region of the polymer brush and but not in at least one second region of the polymer brush.

In one embodiment, acid-labile groups are used in conjunction with an acid cleavage agent wherein the application of the cleavage agent to the continuous polymer brush is carried out by depositing a film containing a quantity of a radiation-sensitive acid generator (also termed a "photoacid generator or "PAG") onto the continuous polymer brush and subsequently exposing selected regions of the film to radiation, whereby the exposed region then release the photogenerated acid into the polymer brush and react therewith. In another acid-labile/acid cleavage agent embodiment, the polymer brush is impregnated with a photoacid generator and the impregnated brush is imagewise exposed to radiation such that selected regions undergo reaction with the photogenerated acid. Alternatively, base-labile groups and a basic cleavage agent can be used in an analogous manner.

In yet another embodiment, photolabile groups are utilized in conjunction with radiation. The surface-initiated polymerization process is conducted using reactive monomers having photolabile groups attached thereto. The resulting photolabile containing polymer brush is then imagewise exposed to radiation resulting in removal of the photolabile groups in at least one first region of the polymer brush and not in at least one second region of the polymer brush.

BRIEF DESCRIPTION OF THE FIGURES

FIG. 2 schematically illustrates preparation of a patterned continuous polymeric brush on a substrate according to a second embodiment of the invention, wherein a photoacid generator (PAG) is directly introduced into the polymer brush, obviating the need for a sacrificial layer.

FIG. 3 schematically illustrates preparation of a patterned continuous polymeric brush on a substrate according to a third embodiment of the invention, wherein photolabile groups are attached to the polymer brush, obviating the need for a sacrificial layer, acid-labile groups, or a photoacid generator.

DETAILED DESCRIPTION OF THE INVENTION

Figure 1:
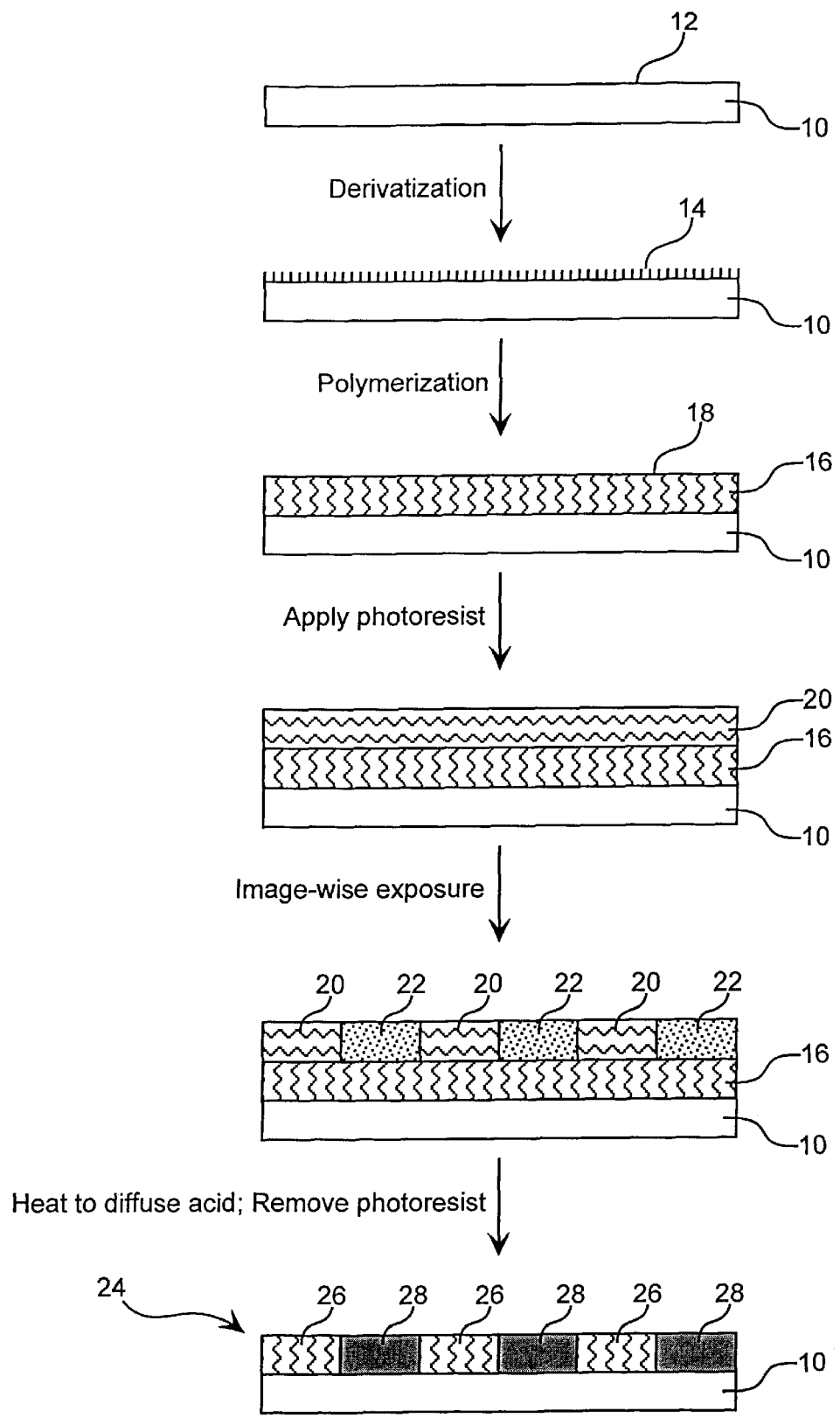
FIG. 1 schematically illustrates preparation of a patterned continuous polymeric brush on a substrate according to a first embodiment of the invention, wherein a sacrificial polymeric layer is employed.

I. OVERVIEW AND DEFINITIONS:

Before describing the present invention in detail, it is to be understood that this invention is not limited to specific reactants, reagents, compositions, components or process steps, as such may vary. It is also to be understood that the terminology used herein is for the purpose of describing particular embodiments only, and is not intended to be limiting.

It must be noted that, as used in this specification and the appended claims, the singular forms "a," "and," and "the" include plural referents unless the context clearly dictates otherwise. Thus, reference to "a polymer" includes combinations of two or more different polymers, reference to "a photoacid generator" includes mixtures of photoacid generators, reference to "an acid-labile group" includes reference to mixtures of different acid-labile groups, and the like.

In describing and claiming the present invention, the following terminology will be used in accordance with the definitions set out below.

The term "polymer" is used to refer to a chemical compound that comprises linked monomers, and that may or may not be linear; in the context of the present invention, the "polymers" are, however, generally linear.

The term "alkyl" as used herein refers to a branched or unbranched saturated hydrocarbon group generally comprising 1 to 24 carbon atoms, such as methyl, ethyl, n-propyl, isopropyl, n-butyl, isobutyl, 1-butyl, octyl, decyl, tetradecyl, hexadecyl, eicosyl, tetracosyl and the like, as well as cycloalkyl groups such as cyclopentyl, cyclohexyl and the like. The term "lower alkyl" intends an alkyl group of one to six carbon atoms, preferably one to four carbon atoms.

The term "alkylene" as used herein refers to a difunctional branched or unbranched saturated hydrocarbon group generally comprising 1 to 24 carbon atoms, such as methylene, ethylene, n-propylene, n-butylene, n-hexylene, decylene, tetradecylene, hexadecylene, and the like. Preferred alkylene groups herein contain 3 to about 20 carbon atoms, preferably 8 to about 12 carbon atoms.

The term "alkoxy" as used herein refers to a substituent —O-alkyl wherein "alkyl" is as defined above. The term "lower alkoxy" refers to such a group wherein the alkyl substituent is lower alkyl.

The term "aryl" as used herein, and unless otherwise specified, refers to an aromatic moiety containing one to five aromatic rings. For aryl groups containing more than one aromatic ring, the rings may be fused or linked. Aryl groups are optionally substituted with one or more inert, nonhydrogen substituents per ring, suitable "inert, nonhydrogen" substituents include, for example, halo, haloalkyl (preferably halo-substituted lower alkyl), alkyl (preferably lower alkyl), alkenyl (preferably lower alkenyl), alkynyl (preferably lower alkynyl), alkoxy (preferably lower alkoxy), alkoxycarbonyl (preferably lower alkoxycarbonyl), carboxy, nitro, cyano and sulfonyl. Unless otherwise indicated, the term "aryl" is also intended to include heteroaromatic moieties, i.e., aromatic heterocycles. Generally the heteroatoms will be nitrogen, oxygen or sulfur. Preferred aryl groups contain one aromatic ring or two fused or linked aromatic rings.

The term "arylene" as used herein, and unless otherwise specified, refers to a bifunctional aromatic moiety containing one to five aromatic rings. Arylene groups are optionally substituted with one or more substituents per ring as set forth above for substitution of an "aryl" moiety.

The term "alkarylene" refers to an alkyl-substituted arylene group, while the term "aralkylene" refers to an aryl-substituted alkylene group.

The term "halo" is used in its conventional sense to refer to a chloro, bromo, fluoro or iodo substituent. In the compounds described and claimed herein, halo substituents are generally bromo, chloro or iodo, preferably bromo or chloro.

The term "hydrocarbyl" is used in its conventional sense to refer to a hydrocarbon group containing carbon and hydrogen, and may be aliphatic, alicyclic or aromatic, or may contain a combination of aliphatic, alicyclic and/or aromatic moieties. Aliphatic and alicyclic hydrocarbyl may be saturated or they may contain one or more unsaturated bonds, typically double bonds. The hydrocarbyl substituents herein generally contain 1 to 20 carbon atoms, and may be substituted with various substituents and functional groups.

The term "hydrocarbylene" as used herein refers to a difunctional branched or unbranched saturated hydrocarbon group, typically containing 1 to 20 carbon atoms.

The term "organic ester" refers to a substituent —COOR wherein R is an organic substituent; preferred "organic esters" herein are "alkyl esters" wherein R is "alkyl" as defined above. Particularly preferred alkyl esters are tertiary alkyl esters, i.e., R is a tertiary alkyl group.

The term "inert" to refer to a substituent or compound means that the substituent or compound will not undergo modification either (1) in the presence of reagents that will likely contact the substituent or compound, or (2) under conditions that the substituent or compound will likely be subjected to (e.g., chemical processing carried out subsequent to attachment an "inert" moiety to a substrate surface). By contrast, the term "labile" refers to a substituent that will undergo modification in the presence of one or more known reagents, e.g., "acid-labile" groups react in the presence of acid.

"Optional" or "optionally" means that the subsequently described circumstance may or may not occur, so that the description includes instances where the circumstance occurs and instances where it does not. For example, the phrase "optionally substituted" means that a non-hydrogen substituent may or may not be present, and, thus, the description includes structures wherein a non-hydrogen substituent is present and structures wherein a non-hydrogen substituent is not present.

II. THE SURFACE "PATTERNING" METHOD:

The invention is directed to a method for forming a continuous polymer brush that is patterned into two or more chemically distinct regions, wherein the method is generally applicable regardless of substrate material, the nature of the surface, or the reagents used, so long as the substrate has a surface to which molecular moieties can covalently bind.

In a first embodiment, the method involves the following steps: (a) identifying predetermined regions on a substrate surface that correspond to a desired pattern (sometimes referred to herein as the "predetermined pattern"); (b) contacting the surface with a polymerization composition under conditions effective to provide a continuous polymer brush that is covalently linked, either directly or indirectly, to the substrate surface, wherein the polymerization composition is such that the continuous polymer brush contains labile groups; and (c) applying a cleavage agent to the continuous polymer brush in the predetermined pattern so as to remove labile groups present within the pattern, wherein the cleavage agent is an acidic reagent, a basic reagent, or radiation of a suitable wavelength.

In a second embodiment, acid-labile groups are utilized in conjunction with an acid cleavage agent in the method of the first embodiment. The application of the cleavage agent in step (c) is conducted by depositing a film containing a quantity of a photoacid generator onto the continuous polymer brush and subsequently exposing selected regions of the film to radiation (wherein the selected regions correspond to the predetermined pattern), such that the exposed regions then release photogenerated acid into the underlying polymer brush and react therewith. In some cases, heating is necessary to effect reaction between the photogenerated acid and the acid-labile groups of the polymer brush. The photoacid generator will generally be contained within a layering composition comprising a binder polymer, so that a sacrificial polymer layer is formed that overlies the brush polymer.

In a third embodiment, acid-labile groups and an acid cleavage agent are utilized to provide a method for forming a continuous polymer brush that is patterned into two or more chemically distinct regions, the method comprising: (a) identifying predetermined regions on a substrate surface that correspond to a predetermined pattern; (b) contacting the surface with a polymerization composition under conditions effective to provide a continuous film of a polymer brush that is covalently linked, either directly or indirectly, to the substrate surface, wherein the polymerization composition is such that the continuous polymer brush contains acid-labile groups; (c) impregnating the polymer brush with a photoacid generator; and (d) imagewise exposing the film of polymer brush to radiation of a wavelength effective to trigger acid generation within the predetermined pattern so as to remove acid-labile groups present therein. Again, this latter step may in some cases requiring heating to effect reaction between the photogenerated acid and the acid-labile groups of the polymer brush.

It will be understood that the aforementioned methods may be conducted using base-labile groups in conjunction with basic cleavage reagents.

A fourth embodiment utilizes photolabile groups in conjunction with radiation as a cleavage agent. The method involves the following steps: (a) identifying predetermined regions on a substrate surface that correspond to a desired pattern (sometimes referred to herein as the "predetermined pattern"); (b) contacting the surface with a polymerization composition under conditions effective to provide a continuous polymer brush that is covalently linked, either directly or indirectly, to the substrate surface, wherein the polymerization composition is such that the continuous polymer brush contains hydrophilic moieties (e.g., alcohol, amine or carboxylic moieties) protected by photolabile groups; and (c) applying radiation as a cleavage agent to the continuous polymer brush in the predetermined pattern so as to remove the photolabile groups present within the pattern. This embodiment of the invention presents additional benefits as the inclusion of acid or base generators is no longer necessary.

A. THE SUBSTRATE SURFACE AND PREPARATION THEREOF:

The surface of the substrate may be comprised of the substrate material itself, i.e., representing simply the exterior of a monolithic solid, or the surface may be in the nature of a thin film or coating deposited upon a substrate. The substrate surface may be formed of a conductive, nonconductive, semiconducting material, or the like, and may comprise, for example, glass, silica, alumina, plastic or other organic polymers, for example, acrylonitrile-butadiene-styrene copolymers, polysulfone, polystyrene, metals, bioerodable materials such as poly(glycolic acid), polyanhydrides, polyorthoesters, polylactic acid, or combinations thereof. Regardless, the substrate surface is such that molecular moieties can bind thereto.

That is, the substrate surface is provided with functional groups that can covalently bind an intact polymer, or, in a preferred embodiment herein, are used as initiation sites to "initiate" successive binding of reactive monomers in a surface-initiated polymerization process. The functional groups may be present on the substrate surface without need for surface modification. However, the functional groups or initiation sites are usually provided by chemically modifying the surface, i.e., by contacting the surface with a derivatizing composition comprised of a derivatizing moiety having a reactive site and a functional group, under reaction conditions effective to promote covalent binding of the derivatizing moiety through its reactive site to the substrate surface, thereby providing surface-bound functional groups. The derivatizing moiety may generally be represented as $R^1$—

(L)$_n$—R$^2$ wherein R$^1$ is a reactive site capable of reaction with the substrate surface, L is an optional linking moiety (n is 0 or 1), and R$^2$ is a functional group which, once the derivatizing moiety is bound to the surface, serves as a polymerization initiation site. The R$^1$ group is selected in concert with the material of the substrate surface; that is, the chemical nature of the substrate surface dictates reactive groups that will enable covalent binding of the derivatizing moiety thereto. Preferred reactive groups suitable as R$^1$ include, for example, sulfur-containing functional groups such as thiols, sulfides, disulfides (e.g., —SR or —SSR where R is alkyl, typically lower alkyl, or aryl), and the like; tri-substituted silanes —SiX$_3$ wherein X is halo or lower alkoxy (typically chloro or methoxy); carboxylic acids; hydroxamic acids; acid chlorides; anhydrides; epoxides; sulfonyl groups; phosphoryl groups; hydroxyl groups; amino acid groups; amides; and the like. The linker L serves to provide physical spacing between the functional group R$^2$ and the substrate surface, and may be polar, nonpolar, positively charged, negatively charged or uncharged, and may be, for example, saturated or unsaturated, linear or branched alkylene, aralkylene, alkarylene, or other hydrocarbylene, such as halogenated hydrocarbylene, particularly fluorinated hydrocarbylene. Preferred linkers are saturated alkylene of 3 to 20 carbon atoms, i.e., —(CH$_2$)$_n$— wherein n is an integer in the range of 3 to 20 inclusive. Most preferably, the length of the linker is in the range of about 8 to about 12 carbon atoms. The functional group R$^2$ extends from the substrate surface after binding of the —L—R$^2$ groups thereto, and allows for further reaction. In particular, R$^2$ comprises a functional group that enables attachment of a polymer thereto or that provides an initiation site for polymerization. Examples of R$^2$ moieties include, but are not limited to, hydroxyl groups, thiol groups, carboxyl groups, epoxide groups, anhydrides, amino groups, alkoxyamine groups, halide substituents, sulfonyl halide groups and acid halide substituents, particularly acid chloride substituents.

B. FORMATION OF THE CONTINUOUS POLYMER BRUSH:

The continuous polymer brush on the substrate surface is synthesized by contacting the surface having surface-bound functional groups with a polymerization composition under conditions effective to result in a continuous polymer brush that is covalently bound to the surface, wherein the polymerization composition is such that the polymer brush formed contains labile groups. These labile groups may be acid-labile, base-labile, or photolabile groups and are typically acid-labile hydroxyl- or carboxyl-protecting groups or photolabile hydroxyl-, carboxyl-or amine-protecting groups.

The polymerization composition may be comprised of an intact polymer capable of covalent attachment to the functional groups on the substrate surface, or, more typically, is comprised of reactive monomers that polymerize using the surface functional groups as polymerization initiation sites. In the former case, the intact polymer will comprise acid-labile, base-labile or photolabile groups, while in the latter case, the acid-, base- or photolabile groups will be present on individual reactive monomers.

With respect to the polymer brush synthesized on the substrate surface, either directly or via a derivatizing compound as described in part (A) of this section, the particular monomers employed and thus the specific resultant polymer are not critical, nor is the mode by which polymerization takes place. Any technique may be used to provide the surface-bound polymer brush, so long as the resultant brush polymers are covalently bound to the substrate surface and provide a sufficient barrier to provide protection of the underlying substrate surface with respect to etching reagents, plating reagents, and the like. It is also necessary that the brush polymer contains acid-, base- or photolabile groups.

One preferred technique for synthesizing a polymer brush containing acid-labile groups involves derivatization of the exposed functional group R$^2$ with a living free radical polymerization initiator followed by living free radical polymerization of substituted or unsubstituted olefinic monomers e.g., vinyl monomers such as acrylic acid, methacrylic acid, acrylate, methyl acrylate, styrene, hydroxystyrene, copolymers of unsubstituted and substituted vinyl phenols such as 2-alkyl or 2,6-dialkyl-4-vinylphenol, and the like, so long as a substantial fraction (greater than about 30 mole %, preferably greater than about 50 mole %, most preferably greater than about 70 mole %) of the brush polymer produced contains acid-labile groups. Suitable living free radical polymerization initiators for use in the aforementioned polymerization method have the structural formula R—O—N(R$^3$R$^4$) in which the free radical R• is capable of initiating the polymerization and the •O—N(R$^3$R$^4$) fragment is capable of end capping the polymerization of vinyl monomers, and R$^3$ and R$^4$ are each independently alkyl or aryl, including substituted and unsubstituted alkyl and aryl, wherein the substituents are, for example, cyano, carboxyl, and the like, or R$^3$ and R$^4$ together form an optionally alkyl-substituted cycloalkyl ring containing 4 to 7, typically 5 or 6, carbon atoms. Suitable R groups are alkyl, alkenyl, aryl, and aryl-substituted alkyl, although preferred R groups comprise halogenated aryl moieties. Examples of specific R groups include phenyl, substituted phenyl (particularly halogenated phenyl such as p-bromophenyl and p-chlorophenyl), benzyl, substituted benzyl (particularly halogenated benzyl and alpha-methyl benzyl), lower alkenyl, particularly allyl, and cyanoisopropyl. Specific examples of such living free radical polymerization initiators are derivatives of 2,2,6,6-tetramethyl-1-piperidinyloxy ("TEMPO"), having the structural formula

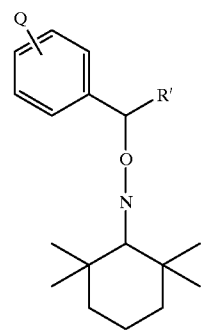

wherein R' is hydrogen, alkyl, halogenated alkyl, phenyl, halogenated phenyl, benzyl or halogenated benzyl, and Q is halogen, preferably chloro or bromo. The "TEMPO" moiety itself has the structural formula.

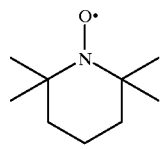

Another example of a living free radical polymerization initiator is the alkoxyamine

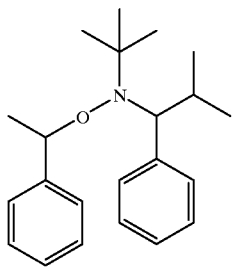

which is derived from the α-hydrido nitroxide

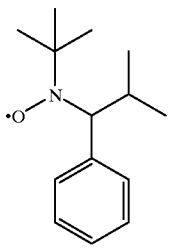

Another preferred polymerization technique for preparing a polymer brush containing acid-labile groups involves surface-initiated ring-opening polymerization ("ROP") of cyclic esters such as lactones, lactides, and the like, in the presence of a suitable promoter, typically an organometallic promoter such as an aluminum alkoxide. For example, $R^2$ may comprise a di(ethylene glycol) group that can serve as a polymerization initiating moiety for the ring-opening polymerization of ε-caprolactone.

The thickness of the polymer coating and polydispersity of the covalently attached polymer changes can be readily controlled, e.g., by the use of an added initiator, by controlling polymerization time and temperature, and the like.

Still other preferred polymerization techniques for preparing brush polymer containing labile groups (including acid-labile, base-labile and photolabile groups) involve controlled procedures that are initiated from well-defined initiating $R^2$ groups that are bound to the substrate surface. These polymerization techniques include, but are not limited to, cationic procedures, metathesis ("ROMP") polymerizations, and the like. Alternatively, the functional group $R^2$ may be involved in condensation polymerizations, in which case $R^2$ undergoes reaction with monomers, oligomers and polymers in the polymerization step.

Polymerization will generally be conducted under bulk conditions, or possibly in a solvent. Suitable solvents are those in which the components of the polymerization composition substantially dissolve. The solution will generally comprise from about 5 to 80, preferably 10 to 70, weight percent solids.

Acid-labile groups on the brush polymer will generally be acid-labile protecting groups present on a hydroxyl, phenolic or carboxylic acid moiety. Most typically, the acid-labile group will be an acid-labile organic ester wherein a carboxylic acid group —COOH present in the polymeric structure is protected as an ester —COOR, and R is generally hydrocarbyl, preferably alkyl, most preferably a tertiary alkyl group such as t-butyl. Alternatively, the acid-labile group will be an acid-labile ether wherein a hydroxyl moiety —OH on the brush polymer is converted to an acid-cleavable ether —OR, where R is such that a stable cation $R^+$ results following acid cleavage; suitable R groups in this case include, but are not limited to, silyl (e.g., trialkylsilyl such as trimethylsilyl) and tetrahydropyranyl. Still other acid-labile groups include alkyl carbonates, particularly tertiary alkyl carbonates.

Photolabile groups on the brush polymer will generally be photolabile protecting groups on hydroxyl, carboxylic acid or amine moieties that are cleavable upon irradiation of the protected compound at 200–350 nm. For a more complete study of photolabile protecting groups, please see Greene et al., *Protective Groups in Organic Synthesis*, (New York: John Wiley & Sons, 1999).

The photolabile group may be an organic ester wherein a carboxylic acid group —COOH present in the polymeric structure is protected as an ester —COOR, and R is generally, but not limited to, a phenacyl, an anthrylmethyl, a nitrophenyl, a nitrobenzyl, or a desyl ester, i.e., α-(3,5-dimethoxyphenyl)phenacyl ester, p-methoxyphenacyl ester, 2-(9,10-dioxo) anthrylmethyl ester, bis(o-nitrophenyl) methyl ester, o-nitrobenzyl ester, and 1-pyrenylmethyl ester. Carboxylic acid groups may also be protected using nitroamides, o-nitroanilides, N-7-nitroindolylamides and N-8-nitro-1,2,3,4-tetrahydroquinolylamides, and the like.

Alternatively the photolabile group may be a photolabile benzyl ether wherein a photo-cleavable ether —OR is cleaved to form a hydroxyl group. Suitable R groups in this case include, but are not limited to, p-methoxybenzyl ether and o-nitrobenzyl ether. Nitrate esters, o-nitrobenzyl carbonates, toluenesulfonates, and carboxylate esters, such as 9-fluorenecarboxylate ester and xanthencarboxylate, may also be used to protect hydroxyl groups.

A third group of suitable photo-labile groups are photolabile carbamates wherein an amine is protected in the polymeric structure as a carbamate. Upon photolytic cleavage the amine group is exposed. Suitable carbamate photolabile groups include, but are not limited to, benzyl carbamates, 3,5-dimethoxy-6-nitrobenzyl carbamate, 3,4-dimethoxy-6-nitrobenzyl carbamate, 1-methyl-1-(3,5-dimethoxyphenyl)ethyl carbamate, o-nitrobenzyl carbamate, m-nitrophenyl carbamate and phenyl(o-nitrophenyl)methyl carbamate. Amine groups may also be protected by N-benzylamines, benzylsulfonamides, 4-(4',8'-dimethoxynaphthylmethyl)-benzenesulfonamides, 4,5-diphenyl-3-oxazolin-2-ones, N-methylamines, N-o-nitrobenzylamines and toluenesulfonamides, etc.

C. THE PHOTOACID GENERATOR:

A variety of photoacid generators can be used in conjunction with the acid-labile and acid cleavage embodiments of the present invention. Generally, suitable acid generators have a high thermal stability (preferably to temperatures greater than 140° C.) so they are not degraded during pre-exposure processing. Suitable acid generators include ionic iodonium sulfonates, e.g., diaryl iodonium (alkyl or aryl) sulfonates such as bis-(di-t-butylphenyl)iodonium camphanylsulfonate, aryl (e.g., phenyl or benzyl) triflates and derivatives and analogs thereof, e.g., triphenylsulfonium triflate or bis-(t-butyl phenyl)iodonium triflate; pyrogallol derivatives (e.g., trimesylate of pyrogallol); onium salts such as triarylsulfonium and diaryliodonium hexafluoroantimonates, hexafluoroarsenates, trifluoromethane sulfonates and others; hydroxamic acid esters and hydroxyimide esters such as trifluoromethanesulfonate esters of hydroxyimides; α,α'-bis-sulfonyl-diazomethanes; sulfonate esters of nitro-substituted benzyl alcohols; naphthoquinone-4-diazides; and alkyl disulfones. Other suitable photoacid generators are disclosed in Reichmanis et al. (1991), *Chemistry of Materials* 3:395, and in U.S. Pat. No. 5,679,495 to Yamachika et al., referenced above. Additional suitable acid generators useful in conjunction with the compositions and methods of the invention will be known to those skilled in the art and/or described in the pertinent literature.

The photoacid generator is deposited onto the polymeric brush following polymerization. In one embodiment, the acid generator is contained within a layering composition also containing a polymeric binder, in which case the resist is removed following irradiation and diffusion of acid into the polymer brush. In an alternative embodiment, the continuous polymer brush is directly impregnated with the photoacid generator, so that use of a sacrificial layer is avoided. Formation of the desired predetermined pattern according to these two embodiments will be described in detail below.

D. USE OF A SACRIFICIAL POLYMERIC LAYER:

As noted above, one embodiment of the invention involves application of a photoacid generator to a continuous polymeric brush after completion of brush synthesis, wherein the photoacid generator is contained within a polymer composition such as a layering composition containing a polymeric binder, e.g., poly(methyl methacrylate), poly (methyl methacrylate-co-methacrylic acid), poly(styrene), poly(hydroxystyrene), or the like, and wherein the photoacid generator and binder are dissolved in a suitable solvent, e.g., cyclohexanone, ethyl lactate, propylene glycol methyl ether acetate, etc. The layering composition is used to coat the surface brush using any number of techniques, e.g., spin-coating, dip-coating, spray-coating, or the like, with spin-coating particularly preferred.

This embodiment of the invention is illustrated schematically illustrated in FIG. 1. Initially, surface 12 of substrate 10 is provided with functional groups 14 such as by derivatization with a derivatizing composition as described in part A of this section. Continuous brush polymer 16 is then provided, either by covalent attachment of a suitable polymer to functional groups 14 or by surface-initiated polymerization of reactive monomers wherein functional groups 14 serve as polymerization initiation sites such as in a living free radical polymerization process. In the next step, a layering composition containing a quantity of a photoacid generator is applied to the surface 18 of the brush polymer to form a resist coating 20 thereon. The bilayer structure so formed is then irradiated under normal lithographic conditions, so that the resist coating is imagewise exposed to radiation of a suitable wavelength, generally in the ultraviolet (with deep UV systems such as those that employ 248 nm radiation preferred); X-ray, electron-beam (e-beam) and ion-beam irradiation may also be used. Irradiation causes the photoacid generator to decompose, resulting in acid-containing regions 22. The structure is then heated so that the photogenerated acid diffuses from acid-containing regions 22 into the underlying polymer brush where it undergoes reaction with the acid-labile groups present therein. The sacrificial layer 20, i.e., the remaining photoresist, is then removed by washing in an appropriate solvent, resulting in the desired patterned surface 24 in which discrete hydrophobic regions 26 (still containing the acid-labile group) are present along with hydrophilic regions 28 (now containing acid groups). For example, with a brush polymer comprised of poly(t-butyl acrylate), the hydrophilic regions 28 will be comprised of poly(acrylic acid), while the hydrophobic regions 26 will be comprised of poly(t-butyl acrylate). Using the present method, the discrete areas of hydrophilic and hydrophobic regions can be prepared with resolution down to at least 1.0 micron.

E. DIRECT INTRODUCTION OF THE PAG INTO THE POLYMER BRUSH:

FIG. 2 illustrates an alternative embodiment of the invention, wherein the photoacid generator is directly introduced into the polymeric brush. That is, following preparation of the continuous polymer brush 16, a selected photoacid generator 30 is directly introduced therein, typically by providing a solution of the photoacid generator as a coating over brush 16, e.g., by dip coating, spin coating, or the like (again, with spin coating preferred), such that the photoacid generator infiltrates the polymeric brush. The PAG-containing polymeric brush is then imagewise exposed to radiation of a suitable wavelength and heated so that the resulting acid reacts with the acid-labile groups of the polymer. Again, a desired patterned surface 24 results in which discrete hydrophobic regions 26 are present along with hydrophilic regions 28.

F. USE OF PHOTO-LABILE POLYMERS:

FIG. 3 illustrates an additional embodiment of the invention wherein the continuous polymer brush is a photo-labile polymeric brush 32, typically containing photo-labile protecting groups on hydroxyl, carboxylic acid or amine moieties The polymerization composition may be comprised of an intact polymer capable of covalent attachment to the functional groups 14 on the substrate surface, or, more typically, is comprised of reactive monomers that polymerize using the surface functional groups 14 as polymerization initiation sites. In the former case, the intact polymer will comprise photo-labile groups, while in the latter case, the photo-labile groups will be present on individual reactive monomers. The photo-labile polymeric brush 32 is then imagewise exposed to radiation of a suitable wavelength resulting in the cleavage of the photo-labile groups and the formation of a desired patterned surface 24 in which discrete hydrophobic regions 26 are present along with hydrophilic regions 28.

As is the case with the inclusion of acid-labile groups, the particular monomers and thus the specific resultant polymer employed in this embodiment are not critical, nor is the mode by which polymerization takes place. Any technique may be used to provide the surface-bound polymer brush, so long as the resultant brush polymers are covalently bound to the substrate surface and provide a sufficient barrier to provide protection of the underlying substrate surface with respect to etching reagents, plating reagents, and the like.

III. UTILITY

The patterned polymeric brush prepared using the methods of the invention can be used in a variety of contexts that exploit the presence of high resolution, discrete regions having entirely different surface properties. For example, selective etching can be conducted in which a particular liquid etchant would effectively etch certain regions (e.g., the hydrophobic regions) but not others (e.g., the hydrophilic regions). Selective etching can also be conducted using a dry etching technique in which the discrete surface regions will react differentially to particle bombardment during plasma etching, for example with respect to etch rate and isotropy.

In another context, the patterned polymeric brush may be used in solid-phase chemical synthesis, wherein high resolution, discrete regions of chemically distinct species are to be synthesized in a pattern on a surface. The desired surface chemistry can be carried out on the hydrophilic regions, for example, wherein acidic groups are used as starting points in the chemical synthesis of a molecular moiety on the substrate surface. The hydrophobic regions can remain unmodified or they can be used in a different synthetic process.

The present process is also useful in the fabrication of biosensors, high-density assay plates, and the like. Methods for implementation of the presently disclosed and claimed methods in such areas will be readily apparent to those skilled in the art, based upon the present disclosure as well as the pertinent texts, literature references and patents. For example, in the fabrication of biosensors, the brush polymers may be provided with an exposed functionality including an antigen, antibody, or any of a variety of specific or non-specific binding pairs. Accordingly, the surface-modified substrate may serve a function analogous to that of a microparticle or titer plate that has been prepared for a test assay such as an immunoassay.

It is to be understood that while the invention has been described in conjunction with the preferred specific embodiments thereof, that the foregoing description as well as the examples which follow are intended to illustrate and not limit the scope of the invention. Other aspects, advantages and modifications within the scope of the invention will be apparent to those skilled in the art to which the invention pertains.

All patents, patent applications, and publications mentioned herein are hereby incorporated by reference in their entireties.

EXPERIMENTAL

The following example is put forth so as to provide those of ordinary skill in the art with a complete disclosure and description of how to carry out the method of the invention. Efforts have been made to ensure accuracy with respect to numbers (e.g., quantities, temperature, etc.) but some errors and deviations should be accounted for. Unless indicated otherwise, parts are parts by weight, temperature is in °C and pressure is at or near atmospheric. Additionally, all starting materials were obtained commercially or synthesized using known procedures.

EXAMPLE

A layer of initiating groups was provided on a silica substrate by reacting the alkoxyamine

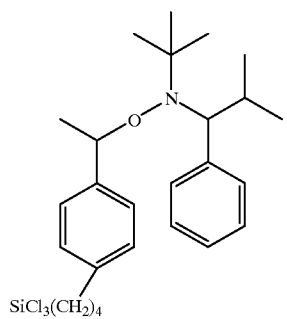

with the surface silanol groups. Controlled surface-initiated polymerization of t-butyl acrylate was conducted by heating the wafer at 125° C. under argon in the presence of t-butyl acrylate and a 19:1 mixture of the above alkoxyamine and the corresponding nitroxide

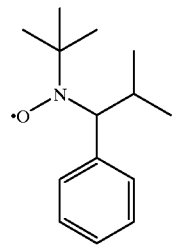

The resulting poly(t-butyl acrylate) brushes were approximately 100 to 200 nm in thickness.

Next, a solution of polystyrene containing bis(t-butylphenyl)iodonium triflate (8 wt. % with respect to the polystyrene) was spin-coated onto the top of the brush layer to give a 1 micron thick sacrificial layer. Exposure to 248 nm radiation (10 mJ/cm) through a mask resulted in the photogeneration of acid in specific areas. To effect image transference into the polymer brush layer, the wafer was heated at elevated temperatures to cause diffusion of the photogenerated acid and promote deprotection of the t-butyl ester groups, resulting in conversion of the poly(t-butyl acrylate) chain of the underlying polymer brush to poly(acrylic acid) chains. The sacrificial layer was then removed by washing with dichloromethane.

Transmission infrared microscopy of the exposed and unexposed regions revealed the expected strong absorbance for the t-butyl ester group at 1725 $cm^{-1}$ in the unexposed regions, which changes dramatically after pattern generation to a broad peak centered at 1690 $cm^{-1}$, a finding that is fully consistent with essentially complete (>95%) conversion to the carboxylic acid groups of a poly(acrylic acid) chain.

The generation of distinct areas of hydrophilic and hydrophobic polymer brushes has a dramatic effect on the surface properties of the films. The advancing contact angle (water) changes from 92° to 15° on going from the poly(t-butyl acrylate) domains to the poly(acrylic acid) domains. This dramatic difference can be further increased in a reversible way by exposure of the poly(acrylic acid) chains to an aqueous solution of trimethylamine. In this case, the carboxylate groups cause the surface domains to be essentially wetted by water, which can then be used to direct the flow or interaction of fluids with the patterned surface.

What is claimed is:

1. A method for forming a continuous polymeric brush that is patterned into two or more chemically distinct regions, comprising:

(a) providing a substrate having a surface to which molecular moieties can covalently bind;

(b) contacting the surface with a polymerization composition under conditions effective to provide a continuous polymer brush, wherein the polymerization composition is such that the continuous polymer brush contains labile groups selected from the group consisting of acid-labile, base-labile and photolabile groups; and (c) applying a cleavage agent selected from the group consisting of acid, base, and radiation to the continuous polymer brush in a predetermined pattern under conditions that promote reaction between the cleavage agent and the labile groups.

2. The method of claim 1, wherein the labile groups are acid-labile and the cleavage agent is acid.

3. The method of claim 2, wherein step (c) is conducted by depositing on the continuous polymer brush a film comprising a photoacid generator which generates an acid upon exposure to radiation, and exposing selected regions of the film to radiation, wherein the selected regions correspond to the predetermined pattern.

4. A method for forming a continuous polymeric brush that is patterned into two or more chemically distinct regions, comprising:

(a) providing a substrate having a surface to which molecular moieties can covalently bind;

(b) contacting the surface with a derivatizing composition comprised of a derivatizing moiety having a reactive site and a functional group under reaction conditions effective to promote covalent binding of the derivatizing moiety through its reactive site to the surface, thereby providing surface-bound functional groups to serve as polymerization initiation sites;

(c) conducting surface-initiated polymerization by contacting the substrate surface provided in step (b) with a polymerization composition under polymerization conditions, wherein the polymerization composition is comprised of monomers having labile groups selected from the group consisting of acid-labile, base-labile, and photolabile groups, thereby forming a continuous polymer brush containing labile groups; and (d) applying a cleavage agent selected from the group consisting of acid, base, and radiation to the continuous polymer brush in a predetermined pattern under conditions that result in removal of the labile groups in at least one first region of the continuous polymer brush but not in at least one second region of the continuous polymer brush.

5. The method of claim 4, wherein the continuous polymer brush provided in step (d) comprises discrete hydrophilic and hydrophobic regions, said hydrophilic regions corresponding to said at least one first region, and said hydrophobic regions corresponding to said at least one second region.

6. The method of claim 3, wherein the labile groups are acid-labile and the cleavage agent is acid.

7. The method of claim 6, wherein step (d) is conducted by depositing on the continuous polymer brush provided in step (c) a film of an acid generating composition comprising a photoacid generator which generates an acid upon exposure to radiation, and exposing selected regions of the film to radiation, wherein the selected regions correspond to the predetermined pattern.

8. The method of claim 6, wherein the acid generating composition is a layering composition that further comprises a polymeric binder.

9. The method of claim 8, wherein the polymeric binder is removed after step (d).

10. The method of claim 9, wherein the removal of the polymeric binder is effected by washing with a solvent.

11. The method of claim 6, wherein the acid-labile groups are organic esters or ethers.

12. The method of claim 11, wherein the acid-labile groups are organic esters.

13. The method of claim 11, wherein the acid-labile groups are alkyl esters.

14. The method of claim 13, wherein the alkyl esters are tertiary alkyl esters.

15. The method of claim 4, wherein the substrate surface is silicon-containing.

16. The method of claim 15, wherein the substrate surface is $SiO_2$.

17. A method for forming a continuous polymeric brush that is patterned into two or more chemically distinct regions, comprising:

(a) providing a substrate having a surface to which molecular moieties can covalently bind;

(b) contacting the surface with a derivatizing composition comprised of a derivatizing moiety having a reactive site and a functional group under reaction conditions effective to promote covalent binding of the derivatizing moiety through its reactive site to the surface, thereby providing surface-bound functional groups to serve as polymerization initiation sites;

(c) conducting surface-initiated polymerization by contacting the substrate surface provided in step (b) with a polymerization composition under polymerization conditions, wherein the polymerization composition is comprised of monomers having photo-labile groups thereby forming a continuous polymer brush containing photo-labile groups; and (d) applying radiation to the continuous polymer brush in a predetermined pattern under conditions that result in removal of the photo-labile groups in at least one first region of the continuous polymer brush and are not removed in at least one second region of the continuous polymer brush.

18. The method of claim 17, wherein the continuous polymer brush provided in step (d) comprises discrete hydrophilic and hydrophobic regions, said hydrophilic regions corresponding to said at least one first region, and said hydrophobic regions corresponding to said at least one second region.

19. The method of claim 18, wherein the substrate surface is silicon-containing.

20. The method of claim 19, wherein the substrate surface is $SiO_2$.

* * * * *